(12) United States Patent
Kwon et al.

(10) Patent No.: US 12,136,549 B2
(45) Date of Patent: Nov. 5, 2024

(54) PLASMA-ENHANCED CHEMICAL VAPOR DEPOSITION OF CARBON HARD-MASK

(71) Applicant: Applied Materials, Inc., Santa Clara, CA (US)

(72) Inventors: Byung Seok Kwon, San Jose, CA (US); Prashant Kumar Kulshreshtha, San Jose, CA (US); Kwangduk Douglas Lee, Redwood City, CA (US); Bushra Afzal, Saratoga, CA (US); Sungwon Ha, Palo Alto, CA (US); Vinay K. Prabhakar, Cupertino, CA (US); Viren Kalsekar, Sunnyvale, CA (US); Satya Teja Babu Thokachichu, San Jose, CA (US); Edward P. Hammond, IV, Hillsborough, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 744 days.

(21) Appl. No.: 16/982,789

(22) PCT Filed: Mar. 21, 2019

(86) PCT No.: PCT/US2019/023306
§ 371 (c)(1),
(2) Date: Sep. 21, 2020

(87) PCT Pub. No.: WO2019/209433
PCT Pub. Date: Oct. 31, 2019

(65) Prior Publication Data
US 2021/0043455 A1 Feb. 11, 2021

Related U.S. Application Data

(60) Provisional application No. 62/662,093, filed on Apr. 24, 2018.

(51) Int. Cl.
*H01L 21/033* (2006.01)
*C23C 16/26* (2006.01)
(Continued)

(52) U.S. Cl.
CPC .......... *H01L 21/0332* (2013.01); *C23C 16/26* (2013.01); *C23C 16/46* (2013.01);
(Continued)

(58) Field of Classification Search
None
See application file for complete search history.

(56) References Cited

U.S. PATENT DOCUMENTS 6,939,808 B2 9/2005 Tzou et al.
6,967,072 B2 11/2005 Latchford et al.
(Continued)

FOREIGN PATENT DOCUMENTS

CN 103210480 A 7/2013
CN 104517815 A 4/2015
(Continued)

OTHER PUBLICATIONS

International Search Report and Written Opinion dated Jul. 5, 2019 for Application No. PCT/US2019/023306.
(Continued)

*Primary Examiner* — Asok K Sarkar
(74) *Attorney, Agent, or Firm* — Patterson + Sheridan, LLP

(57) ABSTRACT

In one or more embodiments, a method for depositing a carbon hard-mask material by plasma-enhanced chemical vapor deposition (PECVD) includes heating a substrate contained within a process chamber to a temperature in a range from about 100 C to about 700 C and producing a plasma with a power generator emitting an RF power of greater than 3 kW. In some examples, the temperature is in
(Continued)

a range from about 300 C to about 700 C and the RF power is greater than 3 kW to about 7 kW. The method also includes flowing a hydrocarbon precursor into the plasma within the process chamber and forming a carbon hard-mask layer on the substrate at a rate of greater than 5,000/min, such as up to about 10,000/min or faster.

20 Claims, 3 Drawing Sheets

(51) Int. Cl.
  *C23C 16/46* (2006.01)
  *C23C 16/505* (2006.01)
  *H01L 21/02* (2006.01)
(52) U.S. Cl.
  CPC ...... *C23C 16/505* (2013.01); *H01L 21/02115* (2013.01); *H01L 21/02274* (2013.01)

(56) References Cited

U.S. PATENT DOCUMENTS

| | | | |
|---|---|---|---|
| 7,064,078 B2 | 6/2006 | Liu et al. |
| 7,079,740 B2 | 7/2006 | Vandroux et al. |
| 7,205,228 B2 | 4/2007 | Padhi et al. |
| 7,256,139 B2 | 8/2007 | Moghadam et al. |
| 7,381,644 B1 | 6/2008 | Subramonium et al. |
| 7,407,893 B2 | 8/2008 | Seamons et al. |
| 7,638,440 B2 | 12/2009 | Wang et al. |
| 7,867,578 B2 | 1/2011 | Padhi et al. |
| 8,133,819 B2 | 3/2012 | Wang et al. |
| 8,227,352 B2 | 7/2012 | Yu et al. |
| 8,361,906 B2 | 1/2013 | Lee et al. |
| 9,320,387 B2 | 4/2016 | Reddy et al. |
| 9,390,910 B2 | 7/2016 | Kulshreshtha et al. |
| 9,837,265 B2 | 12/2017 | Kulshreshtha et al. |
| 9,892,941 B2 | 2/2018 | Cui et al. |
| 10,373,822 B2 | 8/2019 | Kulshreshtha et al. |
| 2004/0180551 A1 | 9/2004 | Biles et al. |
| 2007/0125762 A1 | 6/2007 | Cui et al. |
| 2007/0202640 A1 | 8/2007 | Al-Bayati et al. |
| 2010/0093187 A1 | 4/2010 | Lee et al. |
| 2012/0208367 A1 | 8/2012 | Kim |
| 2014/0057454 A1* | 2/2014 | Subramonium .. H01J 37/32091 438/763 |
| 2015/0093915 A1 | 4/2015 | Reddy et al. |
| 2016/0005596 A1* | 1/2016 | Behera ............. H01L 21/02115 438/703 |
| 2016/0099147 A1 | 4/2016 | Kulshreshtha et al. |
| 2017/0062218 A1 | 3/2017 | Duan et al. |
| 2017/0178899 A1* | 6/2017 | Kabansky ............. C23C 16/045 |

FOREIGN PATENT DOCUMENTS

| | | |
|---|---|---|
| CN | 107075671 A | 8/2017 |
| CN | 107587121 A | 1/2018 |
| JP | 2006156539 A | 6/2006 |
| JP | 2012019211 A | 1/2012 |
| JP | 2012506151 A | 3/2012 |
| JP | 2015070270 A | 4/2015 |
| KR | 100765806 B1 | 10/2007 |
| KR | 20170093002 A | 8/2017 |
| TW | 201718918 A | 6/2017 |
| TW | 201730962 A | 9/2017 |

OTHER PUBLICATIONS

Japanese Office Action dated Mar. 22, 2023 for Application No. 2020-558627.
Japanese Office Action dated Sep. 22, 2023 for Application No. 2020-558627.
Korean Office Action dated Sep. 26, 2023 for Application No. 10-2020-7033340.
Chinese Office Action dated Jun. 21, 2024 for Application No. 201980028076.6.

* cited by examiner

PLASMA-ENHANCED CHEMICAL VAPOR DEPOSITION OF CARBON HARD-MASK

BACKGROUND

Description of the Related Art

Carbon chemical vapor deposition (CVD) processes are increasingly prevalent for hard-mask application for semiconductor device fabrication. As semiconductor devices start to require higher memory density and thicker multi-stack structure (e.g., 3D V-NAND, 3D ReRAM), capability of developing a carbon hard-mask film which can withstand the long etch time is becoming a necessity. In order to achieve such goal, there are two approaches: 1) increase the deposited film thickness in order to compensate for the longer etch time, and 2) develop a more etch selective carbon hard-mask at high temperature despite of low deposition rate. For both approaches, the disadvantage is the significant throughput reduction due to longer process time for 1) thicker film, and/or 2) slower deposition rate. This significant drop in throughput is detrimental to manufacturer cost-of-ownership, floor space, and productivity. With conventional CVD systems, more tools may be needed to match the throughput. However, due to limited floor space, the throughput improvement is needed. In addition, the current CVD process has poor thickness margin (generally less than 2 μm) for local charge build up and inconsistent charge dissipation path, mostly leading to the potential risk of catastrophic failure due to instant discharge at film thicknesses greater than 2 μm. Due to extremely low estimated throughput (less than 50%) and increase failure rate due to inconsistent charge dissipation, future devices with 96× or 128× ON stack would not be feasible, limiting extendibility of high temperature carbon hard-mask.

Thus, there is a need for methods to deposit carbon hard-mask by CVD with greater thickness and a reduced throughput relative to previous processes.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

SUMMARY OF THE INVENTION

Figure 1:
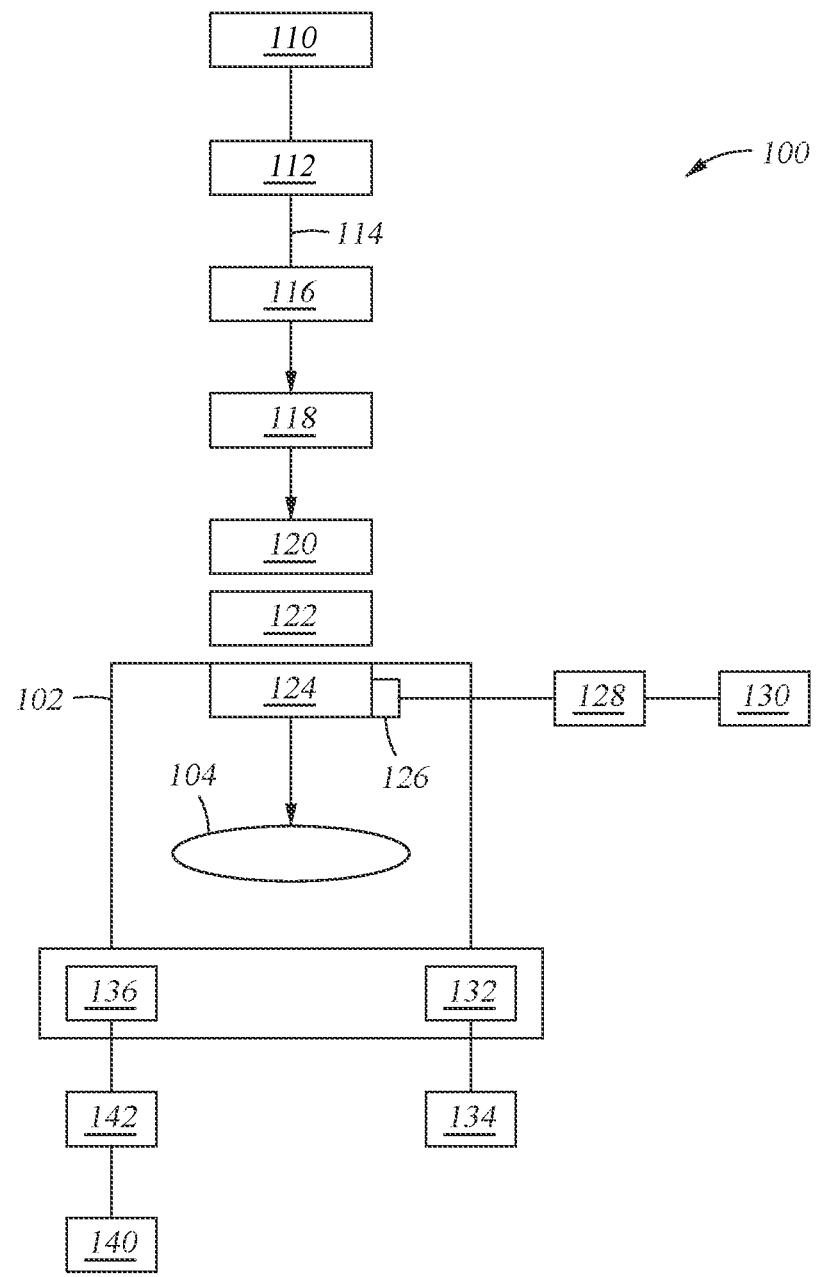
FIG. 1 depicts a schematic of a plasma-enhanced chemical vapor deposition system that can be used to deposit carbon hard-mask layers and other materials, as discussed and described in one or more embodiments herein.

In one or more embodiments, a method for depositing a carbon hard-mask material by plasma-enhanced chemical vapor deposition (PECVD) includes heating a substrate contained within a process chamber to a temperature in a range from about 100° C. to about 700° C. and producing a plasma with a power generator emitting an RF power of greater than 3 kW. In some examples, the temperature is in a range from about 300° C. to about 700° C. and the RF power is greater than 3 kW to about 7 kW. The method also includes flowing a hydrocarbon precursor into the plasma within the process chamber and forming a carbon hard-mask layer on the substrate at a rate of greater than 5,000 Å/min, such as up to about 10,000 Å/min or faster.

In other embodiments, a method for depositing a carbon hard-mask material by PECVD includes heating a substrate contained within a process chamber to a temperature in a range from about 100° C. to about 700° C. and producing a plasma with a power generator emitting an RF power of greater than 3 kW. The method also includes flowing a hydrocarbon precursor and a dopant precursor into the plasma within the process chamber and forming a carbon hard-mask layer on the substrate at a rate of greater than 5,000 Å/min to about 10,000 Å/min. The dopant precursor can be or include, but is not limited to, one or more nitrogen-containing precursors, one or more sulfur-containing precursors, one or more boron-containing precursors, or any combination thereof.

DETAILED DESCRIPTION

Embodiments discussed and described herein provide methods and systems for depositing carbon materials, such carbon hard-mask layers, on a surface of a substrate. In one or more embodiments, a method for depositing a carbon hard-mask material by plasma-enhanced chemical vapor deposition (PECVD) is provided and discussed below. One or more substrates can be positioned or otherwise disposed in a process chamber and heated to a predetermined process temperature.

One or more carrier gas and/or one or more reactive species gases are ignited by a power generator emitting an RF power to form the plasma. One or more hydrocarbon precursors, and optionally, one or more dopant precursors, can be flowed through or otherwise exposed to the plasma during the deposition process within the process chamber. Once activated by the plasma, the hydrocarbon precursor is reacted, decomposed, or chemically reduced to produce a carbon hard-mask layer, which is deposited or otherwise formed on the substrate. In an alternative embodiment, one or more dopant precursors can be flowed or otherwise introduced into the process chamber, exposed to the plasma, and reacted, decomposed, or chemically reduced to produce a doped, carbon hard-mask layer.

The carbon hard-mask layer can be deposited or otherwise formed on any type of substrate, such as a silicon wafer. The substrate can include one or more devices disposed thereon. In one or more embodiments, the carbon hard-mask layer is deposited or otherwise formed on one or more devices having a 32-bit architecture (32× ON), a 64-bit architecture (64× ON), a 96-bit architecture (96× ON), or a 128-bit architecture (128× ON).

In one or more embodiments, the plasma is ignited or otherwise generated from the power generator emitting an RF power of about 2.4 kW or greater. For example, the RF power can be about 2.4 kW, about 2.5 kW, about 2.8 kW, about 3 kW, about 3.5 kW, about 4 kW, about 4.5 kW, about 5 kW, or about 5.5 kW to about 6 kW, about 6.5 kW, about 7 kW, about 8 kW, about 9 kW, about 10 kW, about 12 kW, about 15 kW, or greater. In some example, the RF power can be about 2.4 kW to about 15 kW, about 2.4 kW to about 12 kW, about 2.4 kW to about 10 kW, about 2.4 kW to about 7 kW, about 2.4 kW to about 5 kW, about 3 kW to about 15 kW, about 3 kW to about 12 kW, about 3 kW to about 10 kW, about 3 kW to about 7 kW, about 3 kW to about 5 kW, about 3.5 kW to about 12 kW, about 3.5 kW to about 10 kW, about 3.5 kW to about 7 kW, about 3.5 kW to about 5 kW, about 3.5 kW to about 4 kW, about 4 kW to about 12 kW, about 4 kW to about 10 kW, about 4 kW to about 7 kW, about 4 kW to about 5 kW, about 5 kW to about 12 kW, about 5 kW to about 10 kW, or about 5 kW to about 7 kW.

In other embodiments, the plasma is ignited or otherwise generated from the power generator emitting an RF power of greater than 3 kW. For example, the RF power can be greater than 3 kW, such as about 3.5 kW, about 4 kW, about 4.5 kW, about 5 kW, or about 5.5 kW to about 6 kW, about 6.5 kW, about 7 kW, about 8 kW, about 9 kW, about 10 kW, about 12 kW, about 15 kW, or greater. In some example, the RF power can be greater than 3 kW to about 15 kW, greater than 3 kW to about 12 kW, greater than 3 kW to about 10 kW, greater than 3 kW to about 8 kW, greater than 3 kW to about 7 kW, greater than 3 kW to about 5 kW, about 3.5 kW to about 12 kW, about 3.5 kW to about 10 kW, about 3.5 kW to about 7 kW, about 3.5 kW to about 5 kW, about 4 kW to about 12 kW, about 4 kW to about 10 kW, about 4 kW to about 7 kW, about 4 kW to about 5 kW, about 4 kW to about 4.5 kW, about 5 kW to about 12 kW, about 5 kW to about 10 kW, or about 5 kW to about 7 kW.

The carbon hard-mask layer is deposited or formed at a rate of greater than 5,000 Å/min, such as at a rate of about 5,500 Å/min, about 6,000 Å/min, about 6,500 Å/min, about 7,000 Å/min, or about 7,500 Å/min to about 8,000 Å/min, about 8,500 Å/min, about 9,000 Å/min, about 9,500 Å/min, about 10,000 Å/min, about 12,000 Å/min, about 15,000 Å/min, about 18,000 Å/min, about 20,000 Å/min, or greater. For example, the carbon hard-mask layer is deposited or formed at a rate of greater than 5,000 Å/min to about 20,000 Å/min, greater than 5,000 Å/min to about 15,000 Å/min, greater than 5,000 Å/min to about 10,000 Å/min, greater than 5,000 Å/min to about 8,000 Å/min, greater than 5,000 Å/min to about 7,000 Å/min, about 5,500 Å/min to about 15,000 Å/min, about 5,500 Å/min to about 10,000 Å/min, about 5,500 Å/min to about 8,000 Å/min, about 5,500 Å/min to about 7,000 Å/min, about 7,000 Å/min to about 15,000 Å/min, about 7,000 Å/min to about 10,000 Å/min, about 7,000 Å/min to about 9,000 Å/min, or about 7,000 Å/min to about 8,000 Å/min.

The carbon hard-mask layer is formed to a thickness of greater than 2 µm, greater than 2.2 µm, greater than 2.5 µm, or greater than 2.7 µm, such as about 2.8 µm, about 3 µm, about 3.5 µm, about 4 µm, or about 5 µm to about 5.5 µm, about 6 µm, about 7 µm, about 8 µm, about 9 µm, about 10 µm, about 12 µm, about 15 µm, about 18 µm, about 20 µm, about 25 µm, or thicker. For example, the carbon hard-mask layer is formed to a thickness of greater than 2 µm to about 20 µm, greater than 2 µm to about 15 µm, greater than 2 µm to about 10 µm, greater than 2 µm to about 7 µm, greater than 2.5 µm to about 20 µm, greater than 2.5 µm to about 15 µm, greater than 2.5 µm to about 10 µm, greater than 2.5 µm to about 7 µm, greater than 3 µm to about 20 µm, greater than 3 µm to about 15 µm, greater than 3 µm to about 10 µm, or greater than 3 µm to about 7 µm.

The process temperature of the substrate can be about 100° C., about 150° C., about 200° C., about 250° C., or about 300° C. to about 350° C., about 400° C., about 450° C., about 500° C., about 550° C., about 600° C., about 650° C., about 700° C., or greater. For example, the process temperature of the substrate can be about 100° C. to about 700° C., about 100° C. to about 650° C., about 100° C. to about 600° C., about 100° C. to about 500° C., about 100° C. to about 400° C., about 300° C. to about 700° C., about 300° C. to about 650° C., about 300° C. to about 600° C., about 300° C. to about 550° C., about 300° C. to about 500° C., about 500° C. to about 700° C., about 500° C. to about 650° C., about 500° C. to about 600° C., about 500° C. to about 550° C., or about 550° C. to about 650° C.

The pressure in the process chamber can be about 1 Torr, about 2 Torr, about 3 Torr, about 4 Torr, or about 5 Torr to about 6 Torr, about 8 Torr, about 10 Torr, about 15 Torr, about 20 Torr, about 30 Torr, about 50 Torr, or greater. For example, the pressure in the process chamber can be about 1 Torr to about 30 Torr, about 1 Torr to about 20 Torr, about 1 Torr to about 15 Torr, about 1 Torr to about 10 Torr, about 1 Torr to about 8 Torr, about 1 Torr to about 5 Torr, about 3 Torr to about 30 Torr, about 3 Torr to about 20 Torr, about 3 Torr to about 15 Torr, about 3 Torr to about 10 Torr, about 3 Torr to about 8 Torr, about 3 Torr to about 5 Torr, about 5 Torr to about 30 Torr, about 5 Torr, to about 20 Torr, about 5 Torr to about 15 Torr, about 5 Torr to about 10 Torr, or about 5 Torr to about 8 Torr.

In one or more embodiments, one or more carrier gas and/or one or more reactive species gases are flowed or passed into and through the plasma. The carrier gas and/or the reactive species gas can be or include, but is not limited to, hydrogen, oxygen, argon, neon, helium, krypton, tetrafluoromethane, nitrogen, radicals thereof, or any combination thereof. The flow rate of the carrier gas and/or the reactive species gas can be from about 100 sccm, about 500 sccm, about 1,000 sccm, about 2,000 sccm, about 3,000 sccm, or about 4,000 sccm to about 5,000 sccm, about 6,000 sccm, about 8,000 sccm, about 10,000 sccm, about 12,000 sccm, about 15,000 sccm, about 18,000 sccm, about 20,000 sccm, about 22,000 sccm, about 25,000 sccm, or greater. For example, the flow rate of the carrier gas and/or the reactive species gas can be from about 100 sccm to about 25,000 sccm, about 1,000 sccm to about 23,000 sccm, about 1,000 sccm to about 20,000 sccm, about 1,000 sccm to about 15,000 sccm, about 1,000 sccm to about 10,000 sccm, about 1,000 sccm to about 5,000 sccm, about 2,000 sccm to about 20,000 sccm, about 2,000 sccm to about 15,000 sccm, about 2,000 sccm to about 10,000 sccm, about 2,000 sccm to about 5,000 sccm, about 3,000 sccm to about 20,000 sccm, about 3,000 sccm to about 15,000 sccm, about 3,000 sccm to about 10,000 sccm, about 3,000 sccm to about 5,000 sccm, about 4,000 sccm to about 20,000 sccm, about 4,000 sccm to about 15,000 sccm, about 4,000 sccm to about 10,000 sccm, or about 4,000 sccm to about 5,000 sccm.

In one or more embodiments, the hydrocarbon precursor can be or include, but is not limited to, one or more $C_1$-$C_3$ alkyls, one or more $C_2$-$C_3$ alkenes, one or more $C_2$-$C_3$ alkynes, one or more $C_1$-$C_8$ alcohols, one or more $C_1$-$C_8$ ethers, or any combination thereof. In some examples, the hydrocarbon precursor can be or include, but is not limited to, propylene, acetylene, ethylene, methane, propane, hexane, benzene, isoprene, butadiene, isomers thereof, or any combination thereof.

The flow rate of the hydrocarbon precursor can be from about 100 sccm, about 200 sccm, about 300 sccm, about 500 sccm, about 800 sccm, or about 1,000 sccm to about 1,500 sccm, about 2,000 sccm, about 3,000 sccm, about 4,000 sccm, about 5,000 sccm, or greater. For example, the flow rate of the hydrocarbon precursor can be from about 100 sccm to about 5,000 sccm, about 100 sccm to about 4,000 sccm, about 100 sccm to about 3,000 sccm, about 100 sccm to about 2,000 sccm, about 100 sccm to about 1,000 sccm, about 100 sccm to about 500 sccm, about 200 sccm to about 5,000 sccm, about 200 sccm to about 4,000 sccm, about 200 sccm to about 3,000 sccm, about 200 sccm to about 2,000 sccm, about 200 sccm to about 1,000 sccm, about 200 sccm to about 500 sccm, about 500 sccm to about 5,000 sccm, about 500 sccm to about 4,000 sccm, about 500 sccm to about 3,000 sccm, about 500 sccm to about 2,000 sccm, or about 500 sccm to about 1,000 sccm.

In embodiments a dopant precursor is used to produce a doped, carbon hard-mask material or layer, the dopant precursor can be or include, but is not limited to, one or more of nitrogen-containing precursors, sulfur-containing precursors, boron-containing precursors, or any combination thereof. The nitrogen-containing precursor can be or include, but is not limited to, pyrrole, pyridine, one or more aliphatic amines, one or more aromatic amines, one or more nitriles, salts thereof, or any combination thereof. The sulfur-containing precursor can be or include, but is not limited to, thiophene, carbon disulfide, one or more thiols, salts thereof, or any combination thereof. The boron-containing precursor can be or include, but is not limited to, one or more of diborane, triborane, a trialkyl borane (e.g., triethyl borane), a triallyl borane, or any combination thereof.

The flow rate of the dopant precursor can be from about 100 sccm, about 200 sccm, about 300 sccm, about 500 sccm, about 800 sccm, or about 1,000 sccm to about 1,500 sccm, about 2,000 sccm, about 3,000 sccm, about 4,000 sccm, about 5,000 sccm, or greater. For example, the flow rate of the dopant precursor can be from about 100 sccm to about 5,000 sccm, about 100 sccm to about 4,000 sccm, about 100 sccm to about 3,000 sccm, about 100 sccm to about 2,000 sccm, about 100 sccm to about 1,000 sccm, about 100 sccm to about 500 sccm, about 200 sccm to about 5,000 sccm, about 200 sccm to about 4,000 sccm, about 200 sccm to about 3,000 sccm, about 200 sccm to about 2,000 sccm, about 200 sccm to about 1,000 sccm, about 200 sccm to about 500 sccm, about 500 sccm to about 5,000 sccm, about 500 sccm to about 4,000 sccm, about 500 sccm to about 3,000 sccm, about 500 sccm to about 2,000 sccm, or about 500 sccm to about 1,000 sccm.

FIG. 1 depicts a schematic of a PECVD system 100 that can be used to deposit carbon hard-mask layers and other materials. The PECVD system 100 includes a process chamber 102 containing a substrate support 104. The substrate support 104 can include one or more heaters used to regulate and control the temperature of the substrate support 104 and any substrates disposed thereon.

The PECVD system 100 also includes an RF power generator 112 powdered by an AC box 110. The RF power generator 112 is coupled to and in fluid communication with a dual match 116 via a HN cable 114. In one or more examples, the RF power generator 112 is rated to emit an RF power of greater than 3 kW, such as about 5 kW, about 7 kW, about 10 kW, or greater. Similarly, the HN cable 114 is also power rated to handle the specified RF power emitted from the RF power generator 112. The dual match 116 is coupled to and in fluid communication with the RF strap 118.

The PECVD system 100 also includes a gas box 120, a blocker plate 122, and a face plate 124. The face plate 124 further includes one or more thermal heaters 126 connected to an face plate RF filter 128 and an AC box 130. The lower portion of the PECVD system 100 includes an RF filter 132 powered by an AC box 134 and an RF strap 136 connected to an electrostatic chuck (ESC) 140 and an ESC filter 142 therebetween.

Figure 2:
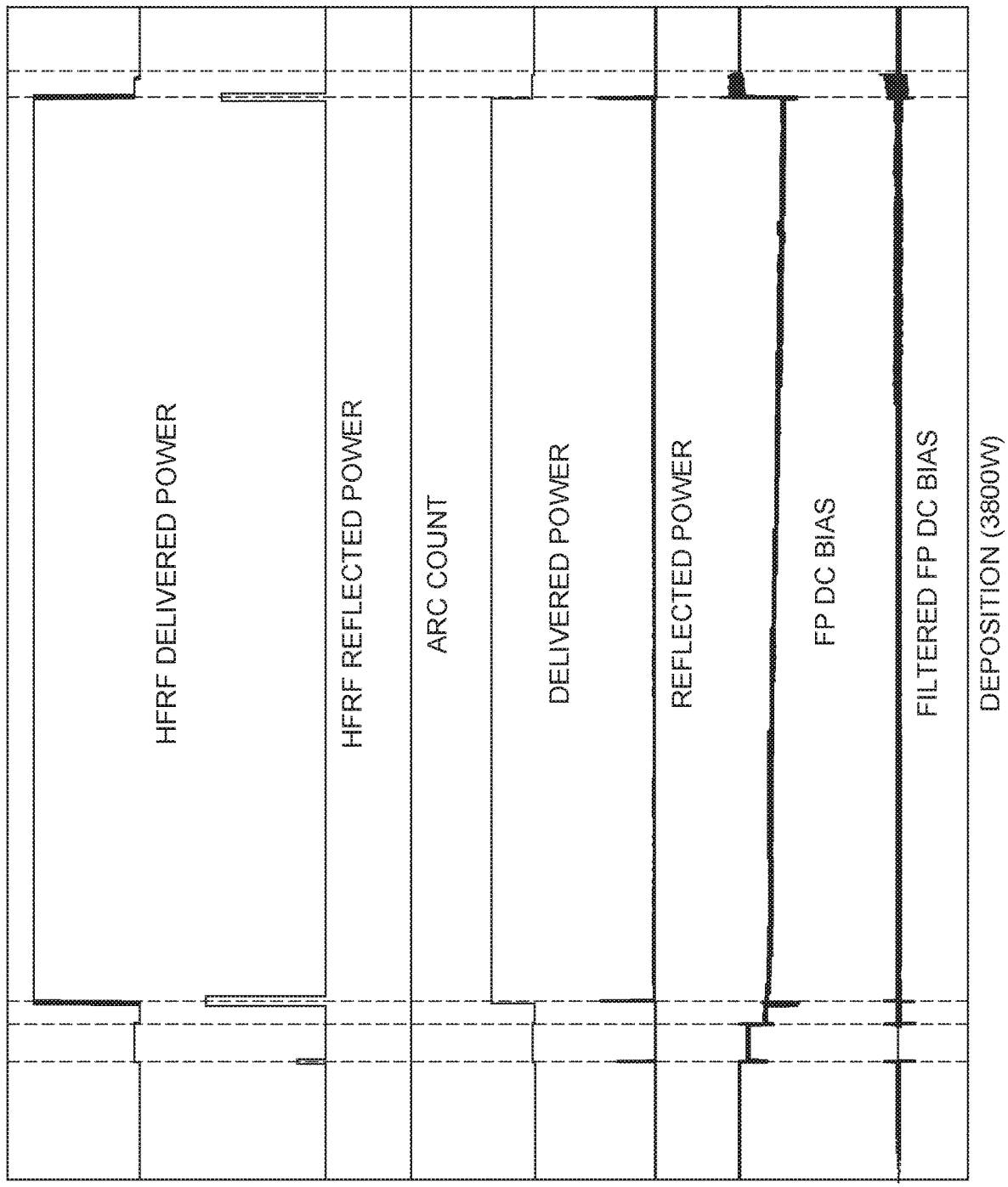
FIGS. 2 and 3 are graphs that depict the delivered RF power, reflected RF power, and arc count data from the RF generator and faceplate bias data while depositing a carbon hard-mask during PECVD processes, as discussed and described in one or more embodiments herein.

FIG. 2 is a graph that depicts the delivered RF power, reflected RF power, and arc count data from the RF generator and faceplate bias data showing the stability of PECVD process using an RF power of about 3.8 kW to deposit a carbon hard-mask with a thickness of about 35,000 Å (about 3.5 μm).

Figure 3:
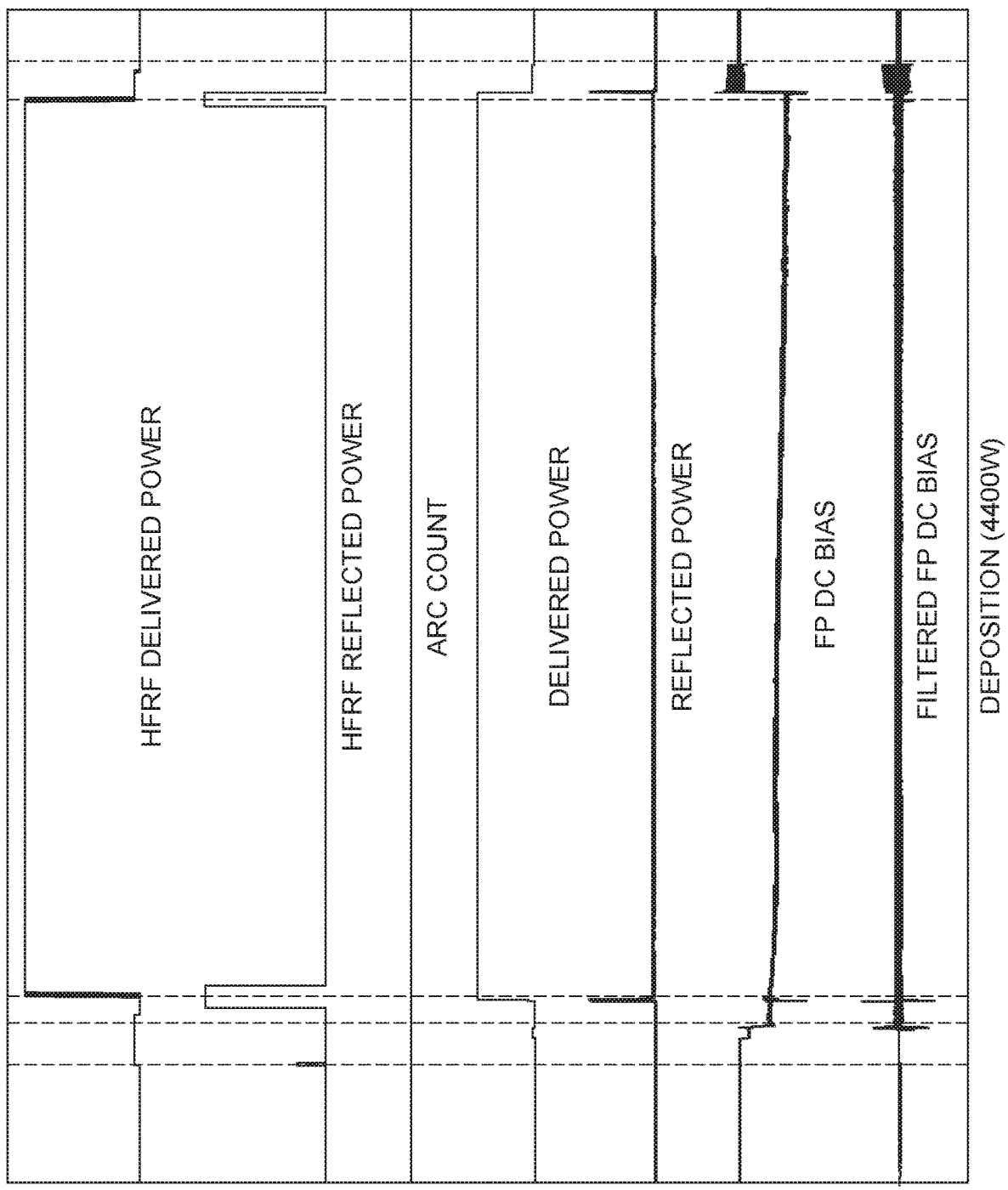

FIG. 3 is a graph that depicts the delivered RF power, reflected RF power, and arc count data from the RF generator and faceplate bias data showing the stability of PECVD process using an RF power of about 4.4 kW to deposit a carbon hard-mask with a thickness of about 35,000 Å (about 3.5 μm).

In some embodiments, high temperature (greater than 600° C.) carbon CVD process, can be used in hard mask patterning for semiconductor device fabrication for its high etch selectivity (greater than 1.5 time) compared to traditional plasma-enhanced CVD (PECVD) carbon process (about 480° C.) while maintaining about 0.3% to about 0.5% defect rate caused by plasma instability. Due to a high etch selectivity, current device node (64× ON) only needs less than 2 μm high temperature carbon film as sufficient thickness. However, as next generation devices require a thicker multi-stack structure (e.g., 96× ON, 128× ON), capability of thicker carbon hard-mask deposition is needed. However, with current high temperature PECVD carbon processes, the throughput is reduced to less than 50% since the deposition rate is greater than 2 times longer. In addition, the current process has poor thickness margin (generally less than 2 μm) for local charge build up and inconsistent charge dissipation path, mostly leading to the potential risk of catastrophic failure due to instant discharge at film thicknesses greater than 2 μm. Due to extremely low estimated throughput (less than 50%) and increase failure rate due to inconsistent charge dissipation, future devices with 96× or 128× ON stack would not be feasible by previously known processes therefore limiting extendibility of high temperature carbon hard-mask.

Embodiments of the present disclosure further relate to any one or more of the following paragraphs:

1. A method, comprising: heating a substrate contained within a process chamber to a temperature in a range from about 100° C. to about 700° C.; producing a plasma with a power generator emitting an RE power of greater than 3 kW; flowing a hydrocarbon precursor into the plasma within the process chamber; and forming a carbon hard-mask layer on the substrate at a rate of greater than 5,000 Å/min.

2. A method, comprising: heating a substrate contained within a process chamber to a temperature in a range from about 300° C. to about 700° C.; producing a plasma with a power generator emitting an RF power of greater than 3 kW to about 7 kW; flowing a hydrocarbon precursor into the plasma within the process chamber; and forming a carbon hard-mask layer on the substrate at a rate of greater than 5,000 Å/min to about 10,000 Å/min.

3. A method, comprising: heating a substrate contained within a process chamber to a temperature in a range from about 100° C. to about 700° C.; producing a plasma with a power generator emitting an RF power of greater than 3 kW; flowing a hydrocarbon precursor into the plasma within the process chamber; flowing a dopant precursor into the plasma within the process chamber, wherein the dopant precursor comprises a nitrogen-containing precursor, a sulfur-containing precursor, a boron-containing precursor, or any combination thereof; and forming a carbon hard-mask layer on the substrate at a rate of greater than 5,000 Å/min to about 10,000 Å/min.

4. The method according to any one of paragraphs 1-3, wherein the RF power is greater than 3 kW to about 7 kW.

5. The method of according to any one of paragraphs 1-4, wherein the carbon hard-mask layer is formed on the substrate at a rate of greater than 5,000 Å/min to about 10,000 Å/min.

6. The method according to any one of paragraphs 1-5, wherein the RF power is greater than 3 kW to about 5 kW, and wherein the carbon hard-mask layer is formed on the substrate at a rate of greater than 5,000 Åmin to about 7,000 Å/min.

7. The method according to any one of paragraphs 1-6, wherein the carbon hard-mask layer is formed to a thickness of greater than 2.5 µm to about 10 µm.

8. The method according to any one of paragraphs 1-7, further comprising flowing a carrier gas into the process chamber, wherein the carrier gas comprises argon, helium, nitrogen, hydrogen, oxygen, radicals thereof, or any combination thereof.

9. The method according to any one of paragraphs 1-8, wherein the hydrocarbon precursor comprises a $C_1$-$C_3$ alkyl, a $C_2$-$C_8$ alkene, a $C_2$-$C_8$ alkyne, or any combination thereof.

10. The method according to any one of paragraphs 1-9, wherein the hydrocarbon precursor comprises propylene, acetylene, ethylene, methane, propane, hexane, benzene, isoprene, butadiene, isomers thereof, or any combination thereof.

11. The method according to any one of paragraphs 1-10, further comprising flowing a dopant precursor into the plasma within the process chamber, wherein the dopant precursor comprises a nitrogen-containing precursor, a sulfur-containing precursor, a boron-containing precursor, or any combination thereof.

12. The method of paragraph 11, wherein the dopant precursor comprises the nitrogen-containing precursor, and wherein the nitrogen-containing precursor comprises pyrrole, pyridine, an aliphatic amine, an aromatic amine, a nitrile, salts thereof, or any combination thereof.

13. The method of paragraph 11, wherein the dopant precursor comprises the sulfur-containing precursor, and wherein the sulfur-containing precursor comprises thiophene, carbon disulfide, a thiol, salts thereof, or any combination thereof.

14. The method of paragraph 11, wherein the dopant precursor comprises the boron-containing precursor, and wherein the boron-containing precursor comprises diborane, triborane, a trialkyl borane, a triallyl borane, or any combination thereof.

15. The method according to any one of paragraphs 1-14, wherein the process chamber is at a pressure in a range from about 3 Torr to about 20 Torr and the temperature is in a range from about 500° C. to about 700° C.

16. The method according to any one of paragraphs 1-15, wherein the carbon hard-mask layer is formed on the device having a 96-bit architecture or a 128-bit architecture.

17. A composition, item, material, substrate, layer, or film produced by the method according to any one of paragraphs 1-16.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method, comprising:
heating a substrate contained within a process chamber to a temperature in a range from about 100° C. to about 700° C.;
producing a plasma with a power generator emitting an RF power of greater than 3 KW;
flowing a hydrocarbon precursor into the plasma within the process chamber; and
forming a carbon hard-mask layer on the substrate at a rate of greater than 5,000 Å/min, wherein the carbon hard-mask layer is formed to a thickness of greater than 2.5 µm to about 10 µm.

2. The method of claim 1, wherein the RF power is greater than 3 kW to about 7 kW.

3. The method of claim 1, wherein the carbon hard-mask layer is formed on the substrate at a rate of greater than 5,000 Å/min to about 10,000 Å/min.

4. The method of claim 1, wherein the carbon hard-mask layer is formed to a thickness of greater than 2.5 µm to about 7 µm.

5. The method of claim 1, further comprising flowing a carrier gas into the process chamber, wherein the carrier gas comprises argon, helium, nitrogen, hydrogen, oxygen, radicals thereof, or any combination thereof.

6. The method of claim 1, wherein the hydrocarbon precursor comprises a $C_1$-$C_8$ alkyl, a $C_2$-$C_8$ alkene, a $C_2$-$C_8$ alkyne, or any combination thereof.

7. The method of claim 1, wherein the hydrocarbon precursor comprises propylene, acetylene, ethylene, methane, propane, hexane, benzene, isoprene, butadiene, isomers thereof, or any combination thereof.

8. The method of claim 1, further comprising flowing a dopant precursor into the plasma within the process chamber, wherein the dopant precursor comprises a nitrogen-containing precursor, a sulfur-containing precursor, a boron-containing precursor, or any combination thereof.

9. The method of claim 8, wherein the dopant precursor comprises the nitrogen-containing precursor, and wherein the nitrogen-containing precursor comprises pyrrole, pyridine, an aliphatic amine, an aromatic amine, a nitrile, salts thereof, or any combination thereof.

10. The method of claim 8, wherein the dopant precursor comprises the sulfur-containing precursor, and wherein the sulfur-containing precursor comprises thiophene, carbon disulfide, a thiol, salts thereof, or any combination thereof.

11. The method of claim 8, wherein the dopant precursor comprises the boron-containing precursor, and wherein the boron-containing precursor comprises diborane, triborane, a trialkyl borane, a triallyl borane, or any combination thereof.

12. The method of claim 1, wherein the process chamber is at a pressure in a range from about 3 Torr to about 20 Torr and the temperature of the substrate contained within the process chamber is in a range from about 500° C. to about 700° C.

13. The method of claim 1, wherein the carbon hard-mask layer is formed on the device having a 96-bit architecture or a 128-bit architecture.

14. A method, comprising:
heating a substrate contained within a process chamber to a temperature in a range from about 300° C. to about 700° C.;
producing a plasma with a power generator emitting an RF power of greater than 3 KW to about 7 KW;
flowing a hydrocarbon precursor into the plasma within the process chamber; and
forming a carbon hard-mask layer on the substrate at a rate of greater than 5,000 Å/min to about 10,000 Å/min, wherein the carbon hard-mask layer is formed to a thickness of greater than 2.5 µm to about 10 µm.

15. The method of claim 14, wherein the RF power is greater than 3 KW to about 5 KW, and wherein the carbon hard-mask layer is formed on the substrate at a rate of greater than 5,000 Å/min to about 7,000 Å/min.

16. The method of claim 14, wherein the carbon hard-mask layer is formed to a thickness of greater than 2.5 µm to about 7 µm.

17. The method of claim 14, wherein the hydrocarbon precursor comprises a $C_1$-$C_8$ alkyl, a $C_2$-$C_8$ alkene, a $C_2$-$C_8$ alkyne, or any combination thereof.

18. The method of claim 14, wherein the process chamber is at a pressure in a range from about 3 Torr to about 20 Torr and the temperature of the substrate contained within the process chamber is in a range from about 500° C. to about 700° C.

19. The method of claim 14, wherein the carbon hard-mask layer is formed on the device having a 96-bit architecture or a 128-bit architecture.

20. A method, comprising:
heating a substrate contained within a process chamber to a temperature in a range from about 100° C. to about 700° C.;
producing a plasma with a power generator emitting an RF power of greater than 3 KW;
flowing a hydrocarbon precursor into the plasma within the process chamber;
flowing a dopant precursor into the plasma within the process chamber, wherein the dopant precursor comprises a nitrogen-containing precursor, a sulfur-containing precursor, a boron-containing precursor, or any combination thereof; and
forming a carbon hard-mask layer on the substrate at a rate of greater than 5,000 Å/min to about 10,000 Å/min, wherein the carbon hard-mask layer is formed to a thickness of greater than 2.5 µm to about 10 µm.

* * * * *